United States Patent [19]

Petr

[11] Patent Number: 4,728,886
[45] Date of Patent: Mar. 1, 1988

[54] METHOD AND APPARATUS FOR CONVERTING AN ELECTRICAL SIGNAL INTO A PROPORTIONAL FREQUENCY

[75] Inventor: Jan Petr, Oberwil, Switzerland

[73] Assignee: LGZ Landis & Gyr Zug AG, Zug, Switzerland

[21] Appl. No.: 904,045

[22] Filed: Sep. 4, 1986

[30] Foreign Application Priority Data

Feb. 10, 1986 [CH] Switzerland .................. 00517/86

[51] Int. Cl.$^4$ .................. G01R 19/26; G01R 1/02
[52] U.S. Cl. .................. 324/120; 324/130
[58] Field of Search .............. 324/120, 130; 307/261, 307/270, 228; 328/127, 128, 15, 150, 151

[56] References Cited

U.S. PATENT DOCUMENTS 3,313,924  4/1967  Schulz et al. .................. 328/128
3,968,447  7/1976  Baylac et al. .................. 328/127
4,124,821 11/1978  Petr .................. 328/151

FOREIGN PATENT DOCUMENTS 2532236  8/1971  U.S.S.R. .................. 324/130
0855506  8/1981  U.S.S.R. .................. 324/120

Primary Examiner—Reinhard J. Eisenzopf
Assistant Examiner—W. Burns
Attorney, Agent, or Firm—Marmorek, Guttman & Rubenstein

[57] ABSTRACT

A method and apparatus for converting an electrical signal into a proportional frequency is disclosed. Modulation of the output frequency resulting from polarity switching cycles having half-periods of unequal duration and capacitor voltages which might be non-zero at the time of polarity reversal are substantially avoided. This permits faster and more precise calibration.

19 Claims, 8 Drawing Figures

4,728,886

METHOD AND APPARATUS FOR CONVERTING AN ELECTRICAL SIGNAL INTO A PROPORTIONAL FREQUENCY

FIELD OF THE INVENTION

This invention relates to a method and apparatus for converting an electric signal into a proportional frequency.

BACKGROUND OF THE INVENTION

Such apparatus may be used in electric meters for the conversion of a signal, which is proportional to an electric power or load, (i.e. a current/voltage product) into a proportional pulse frequency. Illustratively, the frequency refers to the pulse frequency of a signal comprising a train rectangular pulses.

An apparatus of such kind is known from U.S. Pat. No. 4,124,821. There the principle of periodic polarity conversion is used to eliminate an offset-voltage. Normally this offset-voltage, being part of an input signal, cannot be eliminated and depends on time and temperature and thus directly effects the exactness of the signal to frequency conversion as an error in linearity. In the periodic polarity conversion method, the signal that is to be converted to a proportional frequency and the transmission direction of the apparatus are periodically and simultaneously reversed, so that both sign changes mutually cancel each other. However the offset voltage, which only changes sign with the transmission direction, is alternately added to and subtracted from the signal to be converted during successive half period of a switch signal. Thus the integration of the offset-voltage over an integral number of periods of the switch signal results in zero if both half-periods of each switch cycle last equally long.

Since normally the integration capacitor has a non-zero voltage at the time of polarity reversal, errors due to this non-zero votlage are introduced into the conversion result. When the time of measurement is long, these errors do not necessarily have a negative influence on the average of the output pulse frequency. But in any case these errors lead to momentary fluctuations, i.e. to a modulation of the pulse frequency. In the prior art in order to avoid this, the time of polarity reversal is synchronized with the output signal of a comparator, which senses the capacitor-voltage. Thus the polarity reversal always happens at the time of zero crossing of the capacitor voltage. However this solution results in the two half periods not always being the same. Instead they only last an equally long time in a statistic average. Again this leads to an irregular modulation of the output frequency of the apparatus and makes its calibration difficult. Calibration can only be accomplished after an unsatisfactory long time period.

It is the object of this invention to provide an apparatus and method for converting an electrical signal into a proportional pulse frequency in which there is avoided modulation of the output pulse frequency resulting from polarity switching cycles having half periods of unequal duration and capacitor voltages which might be non-zero at the time of polarity reversal so that a faster and more precise calibration of the apparatus is possible.

SUMMARY OF THE INVENTION

The present invention is a method and apparatus for converting an electrical signal into a proportional frequency.

The electrical signal is periodically switched using a first polarity reversing switch. A first reference signal is then added to a signal (i.e., a voltage or current) proportional to the periodically switched electrical signal to form an addition signal. The addition signal is periodically switched with a second polarity reversing switch that is operated synchronously with the first polarity reversing switch.

An integrating capactior is sequentially charged and discharged with a current proportional to the addition signal and a selectively switched reference current. The reference current serves as a second reference signal whose value corresponds to twice the signal value of the first reference signal. A comparator compares the voltage on the capacitor to a reference voltage to control the switching of the reference current, thereby enabling production of a signal whose frequency is proportional to the sum of the electrical signal and the first reference signal. A frequency proportional to the frequency of the first reference signal is subtracted to produce a frequency proportional to the electrical signals.

BRIEF DESCRIPTION OF THE DRAWING

The same reference numerals are used to designate the same parts in all Figures.

DETAILED DESCRIPTION OF THE INVENTION

Figure 1:
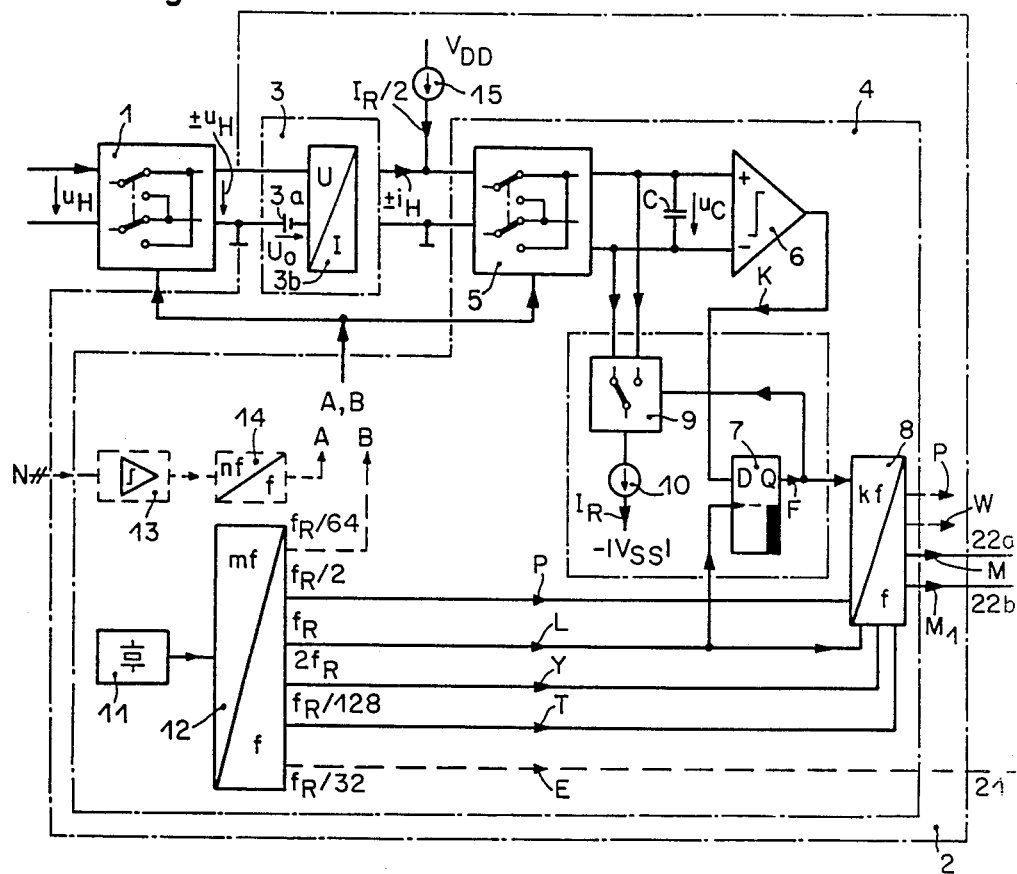
FIG. 1 shows a block diagram of a first alternative of a signal to frequency conversion apparatus, in accordance with an illustrative embodiment of the invention.

All components of the described apparatus are for instance constructed in CMOS-technology. They are fed by a positive direct current supply voltage $V_{DD}$ and a negative direct current supply voltage $-|V_{SS}|$. Both have the ground as reference potential. The direct current supply voltages $V_{DD}$ and $-|V_{SS}|$ may be derived from an alternating-current network with the help of a power rectifier. Even though they are always present, the power rectifier and the direct current supply voltage $V_{DD}$ and $-|V_{SS}|$ are not shown in the drawing for reason of better clarity.

In the drawing, all optional connections and components are shown as dotted lines. All periodic or clock inputs that are controlled with leading pulse edges are symbolically shown in the drawing with a white triangle, while all periodic or clock inputs that are controlled with trailing edges are shown with a black triangle.

The signal $u_H$ that is to be converted into a proportional pulse frequency is either a measured signal, for instance an electric voltage, or a signal derived from measured signals, as for instance an electric power, which is proportional to the product of a current and a voltage.

Figure 2:
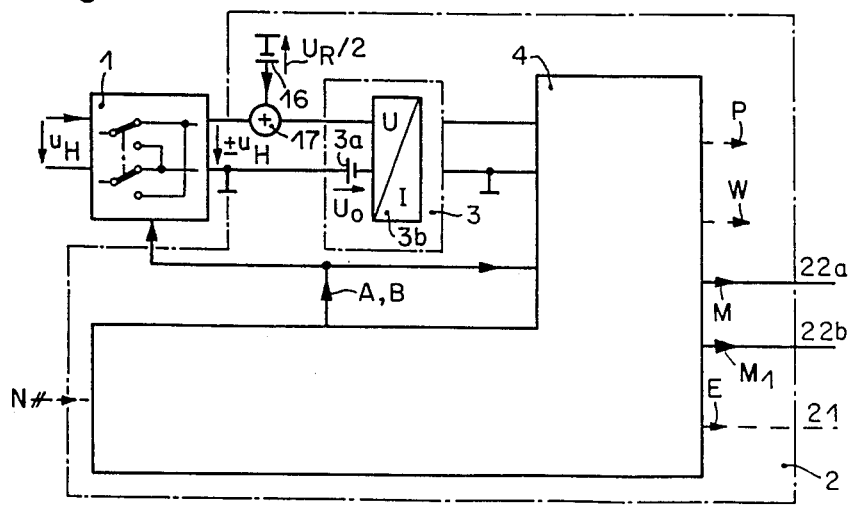
FIG. 2 shows a block diagram of a second alternative of a signal to frequency conversion apparatus, in accordance with a second illustrative embodiment of the inventions.
Figure 3:
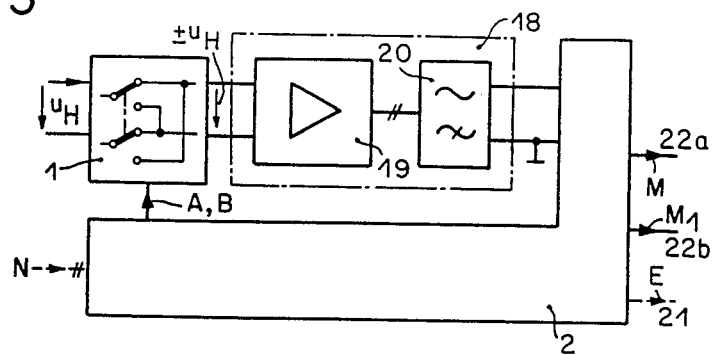
FIG. 3 shows a block diagram of a third alternative of the signal to frequency conversion apparatus, in accordance with a third illustrative embodiment of the invention.

The three alternatives of the apparatus shown in FIGS. 1 through 3 differ primarily in their input part. The three alternatives each comprise a first two pole polarity reversing switch 1 and a circuit 2 connected at the output thereof. The circuit 2 comprises in all cases a voltage/current converter 3 and a circuit 4 connected at the output side thereof. The input of the voltage/current converter 3 is the signal input of circuit 2. Circuit 4 comprises a second two pole polarity reversing switch 5, a capacitor C, a comparator 6, a D-flip-flop 7, an output frequency divider 8, a swtich 9, a source of constant current 10, a synchronizing generator 11, a frequency divider 12, an optional Schmitt Trigger 13, and an optional frequency divider 14.

In the first alternative (see FIG. 1) the circuit 2 comprises another source of constant current 15 which is connected with a non-grounded output pole of the voltage/current converter 3. The constant current source 15 is also connected to the positive direct current supply voltage $V_{DD}$.

In the second alternative (see FIG. 2) the circuit 2 comprises (instead of the current source 15) a constant voltage source 16, whose first pole is connected to a first input of an addition element 17, and whose second pole is grounded. A second input of the addition element 17 forms a non-grounded input pole of circuit 20. The output of the addition element 17 is connected to a non-grounded input of the voltage/current converter 3.

In the third alternative (see FIG. 3) a high-pass amplifier 18 is connected between the first polarity reversing switches 1 and circuit 2. Illustratively, the high-pass amplifier 18 comprises an amplifier 19 and a high-pass filter 20 connected at the output of the amplifier 19.

In the three alternatives (i.e. FIGS. 1, 2, 3) the inputs and outputs of the polarity reversing swtiches 1 and 5 and the voltage/current converter 3 and two-poled. One output pole of voltage/current converter 3 and of switch 1 is connected to ground. The two pole input of the polarity reversing switch 5 is a two pole input of circuit 4.

The two pole output of switch 5 is connected to the capacitor C, whose first pole is connected with a non-inverting input of comparator 6 and by way of switch 9 to a first pole of the source of constant current 10. The second pole of capacitor C is connected to an inverting input of comparator 6 and is connected by way of switch 9 to the first pole of the source of constant current 10. The second pole of the current source 10 is connected to the negative direct current supply voltage $-V_{SS}$. The output of the comparator 6 is connected to the D-input of the D-flip-flop 7. The Q-output of this flip-flop is led to a control input of switch 9 and to a first signal input of the output frequency divider 8.

The output of the synchronizing generator 11 is connected to the input of the frequency divider 12, which for instance comprises six outputs. The first output of the frequency divider 12, where a periodic signal P of frequency $f_r/2$ is located, is connected to a second signal input of the output frequency divider 8. The second output of the frequency divider 12, where a periodic signal L of frequency $f_R$ is located, is connected to a clock input of the D-flip-flop and a first clock input of the output frequency divider 8, while the third output of the frequency divider 12, where a periodic signal T of frequency $f_R/128$ is located, is connected to a second clock input of the output frequency divider 8. The fourth output of the frequency divider 12, where a periodic signal Y of frequency $2f_R$ is located, is connected to a third clock input of output frequency divider 8. The fifth output of frequency divider 12, where a periodic signal E of frequency $f_R/32$ is located, is optional and is for instance used in the electric meter shown in FIG. 6. It is connected with an optional periodic output 21 of circuit 2.

An alternating-current voltage N, for instance a 50 Hertz or 60 Hertz network alternating-current voltage optionally feeds the input of the Schmitt Trigger 13, whose output is connected with the input of the frequency divider 14. The control inputs of the two polarity reversing switches 1 and 5 are connected to each other. They are fed either from the output of the switch frequency divider 14 with a switch signal A or from the sixth output of the cycle frequency divider 12 with a switch signal B. When the switch signal B is used, the Schmitt-Trigger 13 and the switch frequency divider 14 are not needed. Two of the four outputs of the output frequency divider 8 are simultaneously the two signal outputs 22a and 22b of circuit 2.

On one of those two signal outputs, i.e. output 22a, a signal M is located, which corresponds to a positive value of signal $u_H$, while at the other signal output 22b a signal $M_1$ is located, which corresponds to a negative value of signal $u_H$.

The two polarity reversing switches 1 and 5 are each formed substantially identically using CMOS-technology with the help of known analog semiconductor switches. The switch 9 is a one pole switch and may also be constructed in CMOS-technology using known analog semiconductor switches.

The frequency divider 12 and the frequency divider 14 are formed up in CMOS technology for instance with the help of a known binary counter. They enable a synchronized frequency division by a number $2^x$, where x is an even number.

The periodic signal generator 11 is for instance quartz-stabilized and produces periodic rectangular pulses, for instance of the frequency $2^{15}$ Hertz=32,768 kilohertz. This frequency is divided in the frequency divider 12 by m, where m takes on the value $2^4$, $2^5$, $2^6$, $2^{10}$, $2^{11}$ and $2^{12}$, for production of the frequencies $2f_R=2^{11}$ Hertz of periodic signal Y, $f_R=2^{10}$ Hertz of periodic signal L, $f_R/2=2^9$ Hertz of periodic signal P, $f_R/32=2^5$ Hertz of periodic signal E, $f_R/64=2^4$ Hertz=16 Hertz of switch signal B and $f_R/128=2^3$ Hertz of periodic signal T.

The AC voltage N is converted in the Schmitt-Trigger 13 into a periodical rectangular pulse signal of the same frequency. The two switch thresholds of the Schmitt-Trigger 13 are preferably chosen in the such a manner, that the switching in the switch frequency divider 14 at the output happens exactly at the time of the zero crossing of the alternating-current voltage N. In the switch frequency divider 14, the 50 or 60 Hertz frequency of the rectangular pulse signal produced by the Schmitt-Trigger 13 is than divided by n, where n is $2^2$, for production of a frequency of 12.5 or 15 Hertz of switch signal A. The two polarity reversing switches 1 and 5 are thus controlled and switched synchronously and periodically with the frequency 12.5 Hertz or 15 Hertz (switch signal A) or with the frequency 16 Hertz (switch signal B).

In practice the voltage/current converter 3 has an offset voltage $U_o$, that is shown symbolically in FIGS. 1 and 2 by a voltage source 3a. This source is connected in series to an input pole of an ideal, zero offset voltage/current converter 3b. The voltage source 3a and the ideal voltage/current converter 3b together form the non-ideal voltage/current converter 3.

The D-flip-flop 7 is for example controlled with negative (i.e. trailing) edges.

In all three alternatives (see FIGS. 1, 2, 3), a signal $u_H$ (that is to be converted into a proportional pulse frequency) is connected in the form of an electric voltage to the input of polarity reversing switch 1, which is controlled by switch signal A or B. The polarity reversing switch 1 switches the signal $u_H$ periodically. For instance, during all odd numbered half periods of switch signal A or B, the signal $+u_H$ appears at the output of polarity reversing switch 1 and during the even numbered half periods the signal $-u_H$ appears.

In the first alternative (see FIG. 1), the periodically switched signal $\pm u_H$ is converted in the voltage/current converter 3 into a proportional signal current $\pm i_H$. At the output of the voltage/current converter 3, a direct current $I_R/2$ is added as a constant reference signal to the current signal $\pm i_H$, which is produced by the voltage/current converter 3, in order to produce an addition signal $\pm i_H + I_R/2$. The constant current source 15 produces the direct current $I_R/2$.

In the second alternative (see FIG. 2) however, there is first a DC voltage added to the periodically switched signal $\pm u_H$ at the input of the voltage/current converter as a constant reference signal with the help of addition element 17. The addition signal, $\pm u_H + U_R/2$, is converted in the following voltage/current converter 3 into a proportional current signal $\pm i_H + I_R/2$. The current signal $\pm i_H$ corresponds to the signal $\pm u_H$ and the direct current $I_R/2$ to the DC voltage $U_R/2$. The DC Voltage $U_R/2$ is produced by the constant voltage source 16.

Thus in the first and second alternative the input current of polarity reversing switch 5 is a signal $\pm i_H + I_R/2$. The polarity reversing switch 5, that is located between the voltage/current converter 3 and the capacitor C, switches this signal periodically and synchronously with the periodic reversal of signal $u_H$, so that the integration capacitor C constantly receives a current $i_H \pm I_R/2$.

Since, as already mentioned, the voltage/current converter 3 usually comprises at its input an offset voltage $U_o$ that corresponds to a proportional current $I_o$ at the output of the voltage/current converter 3, the input current of polarity reversing switch 5 does in reality not equal $\pm i_H + I_R/2$, but in both alternatives equals $\pm i_H + I_R/2 + I_o$.

The value of the reference signal $U_R/2$ or $I_R/2$ corresponds to half of the reference current $I_R$ that is produced by the constant current source 10. At the same time the value of the reference signal must fulfill the condition $U_R/2 > \pm u_H + U_o$ or $I_R/2 > \pm i_H + I_o$.

Usually, the value of the offset voltage $U_o$ is very small compared to the value of the signal $u_H$. Similarly the value of current $I_o$ is very small compared to the value of current $i_H$, so that only a very small part of the operating range of the apparatus is occupied by the current $I_o$. In applications, when the maximum value of signal $u_H$ is small compared to the offset voltage $U_o$, the operating range left over for the signal $u_H$ can become unacceptably small compared to the operating range occupied by $U_R/2$ or $I_R/2$. That is why in accordance with the third alternative (see FIG. 3), it is of advantage of amplify the periodically switched signal $\pm u_H$ in the high pass amplifier 18 before it is led to circuit 2 for further processing. Thus, the relation between the signal current $i_H$ and current $I_o$ or between the signal $u_H$ and the offset voltage $U_o$ is improved. The high pass amplifier 18 has no or only very low DC voltage amplification. This, for instance, is realized through the use of high pass filter 20 in the high pass amplifier 18. The time constant of high pass amplifier 18 must be chosen small enough, so that the amplified, signal $\pm u_H$ is transmitted with a sufficiently small distortion. In the third alternative (FIG. 3), the circuit 2 has the construction shown in FIG. 1 or in FIG. 2.

The voltage/current converter 3 and the capacitor C at its output together make up an integrator 3;C in all three alternatives. The comparator 6 that is connected at the output side of integrator 3;C is controlled by the capacitor voltage $u_C$ in order to control the switching on and off of the constant reference current $I_R$ that is produced by the constant current source 10. In the case, that the signal $u_H$ is constant and positive and the offset voltage $U_o$ is zero, the temporal course of the capacitor voltage $u_C$ is shown in the second line of FIG. 4. In this case, the capacitor voltage $u_C$ is a saw-tooth-shaped. Its edges have constant inclinations. All positively sloped edges are parallel and all negatively sloped edges are parallel.

The switch 9 that is controlled by the D-flip-flop 7 serves to switch the reference current $I_R$ on and off. As previously indicated a current $i_H \pm I_R/2 \pm I_o$ is delivered to the capacitor C from the polarity reversing switch 5. The plus sign refers to odd half periods and the minus sign refers to even half periods of the swtich signal A or B. When, at the beginning, the output signal F of the D-flip-flop 7 has a logical value "0", then, at the beginning, the switch 9 takes the position shown in FIG. 1. Then, during the odd half periods of the switch signal A or B—(i.e. during those half periods the polarity reversing switch 5 takes the position shown in FIG. 1)—the constant current source 10 is connected to the output connection of polarity reversing swtich 5 that is momentarily grounded. The reference current $I_R$ of the constant current source 10 flows into the ground and cannot charge the capacitor C. Thus, during each odd half wave of the switch signal A or B, the capacitor C is only charged by the polarity reversing switch 5 with the current $i_H + I_R/2 + I_o$. Accordingly, the voltage $u_C$ increases. The comparator 6 has, for instance, an input threshold value of "0" volts. If the voltage $u_C$ surpasses the input threshold value of the comparator 6, then its output signal K changes its value from the logic value "0" to a logic value "1". The temporal course of the output signal K of the comparator 6 is shown in the third line of FIG. 4. The change of state of the output signal F occurs when the next negative (i.e. trailing) edge of the high frequency periodic signal L enters the D-flip-flop 7. In other words, the output signal F changes state on the trailing edge of the pulse in signal L which immediately follows the change in state of the signal K. The D-flip-flop 7 serves to synchronize the rectangular output signal K of the comparator 6 with the rectangular periodic signal L. The frequency of this periodic signal L is, as already mentioned, for instance $2^{10}$. The temporal course of the cycle signal L is shown in the first line of FIG. 4 and the temporal course of the rectangular output signal F of the D-flip-flop 7 is shown in the fourth line of FIG. 4. The change of value at the output of the D-flip-flop 7 (i.e. the output signal F) controls the switch 9. Now, the switch 9 takes the position opposite to the one shown in FIG. 1. In this case, the reference current $I_R$ of the constant current source flows through the capacitor C.

The charge current of the capacitor C thus equals: $i_H+I_R/2+I_o-I_R=i_H-I_R/2+I_o$, i.e. the term $I_R/2$ has changed its sign. But since, as already mentioned, the condition $i_R/2>i_H+I_o$ applies, the resulting charge current is negative.

The voltage $u_C$ at the capacitor C decreases and, when if falls below the input threshold value of the comparator 6, the output signal K again takes its original logic value "0". After the next trailing edge of the signal L, the output signal F and switch 9 change state. This results in the switch 9 taking its original position, so that a new cycle can begin. This repeats itself as many times until the odd half period of the switch signal A or B is finished. One single discharge of the capacitor C, performed with the help of the reference current $I_R$, corresponds to each pulse of the output signal F.

We now consider the even half periods of the switching signal A or B. At the end of each off half period of the switch signal A or B, the two polarity reversing switches 1 and 5 are switched synchronously by the switch signal A or B, so that both of them take the opposite position to the one shown in FIG. 1. By the switching of polarity reversing switch 5, the capacitor C and the constant current source 10 are switched. This time, in the position of switch 9 shown in FIG. 1, the constant current source 10 is arranged so that the capacitor is charged by polarity reversing switch 5 with the current $i_H-I_R/2-I_o$ and also by the constant current source 10 with the reference current $I_R$.

Thus the total charge current is:

$$i_H-I_R/2-I_o+I_R=i_H+I_R/2-I_o.$$

The capacitor voltage $u_C$ increases and, if it surpasses the input threshold value of the comparator 6, the comparator's output signal K changes its value from logic value "0" to the logic value "1". This change of value results in the switch 9 being swtiched in a manner already described. As a result the constant current source 10 is connected to the grounded connection of the capacitor C. The capacitor C is now only charged by switch 5 with the current $i_H-I_R/2-I_o$ which is negative, since the condition $i_R/2>/\pm I_H+I_o$ applies. The capacitor voltage $u_C$ decreases and, if it falls below the input threshold value of the comparator 6, then the comparator's output signal changes its value back to the logic value "0". By this, the switch 9 is switched back in its original position, so that a new cycle can begin.

Summarizing, the following applies:

During an odd half period of the switch signal A or B, the capacitor C is alternatingly charged with a current $i_H+I_R/2+I_O$ and discharged with a current $i_H-I_R/2+I_O$. However, during an even half period of the switch signal A or B, the capacitor C is alternatingly charged with a current $i_H+I_R/2-I_O$ and discharged with a current $i_H-I_R/2-I_O$. The two kinds of half periods differ only in the sign of the current $I_O$. Since the switch signals A and B have equally long half periods because of the method of their production, and since the sign of the current $I_O$ is different into successive half periods, $I_O$ eliminates itself and thus the influence of the offset voltage $U_O$ eliminates itself as well by an integration over an even number of periods of the switch signal A or B or by an integration over a long enough period.

The charge, that is constantly fed into the capacitor C during each odd half period through the current $i_H-I_R/2+I_O$ from the polarity reversing switch 5, is continuously withdrawn from it each time in small exactly defined charge quanta $Q_R=I_R/f_R$ by adding the constant current source 10. One rectangular pulse per charge quantum is released at the Q-output of the D-flip-flop 7 (See signal F in FIG. 4). The charge, that is constantly withdrawn from the capacitor C during each even half period by the current $i_H-I_R/2-I_O$ from the polarity reversing switch 5, is continuously lead back into the capacitor each time in small, constant, exactly defined charge quantities $Q_R$ by adding the constant current source 10, so that the total charge current of the capacitor C corresponds to the addition current $(i_H-I_R/2-I_O)+I_R=i_H+I_R/2-I_O$. This time also, one rectangular pulse per charge quantum is released at the Q-output of the D-flip-flop 7. Each one of these pulses is thus a measure for the small, exactly defined charge quantum, that is withdrawn from the capacitor C or lead to it with the help of the reference current $I_R$. Depending on the switching of the capactior C, the polarity of the charge current $i_H+I_R/2\pm I_O$ is unchanged. Thus the charge that, at the time of the periodical switching, is left in the capacitor C is taken into account in the following half period with the correct polarity, so that no modulation of the output frequency is caused by the charge present in the capacitor at the time of the periodical switching.

The output signal of the D-flip-flop 7 that was produced with the help of the integration and the help of the comparator 6 comprises rectangular pulses. The average frequency $f_F$ of these pulses is proportional to the addition current $i_H+I_R/2$ and thus is too large by a constant frequency $f_R/2$. Frequency $f_R/2$ is the frequency that corresponds to the value of the reference signal $U_R/2$ or $I_R/2$. The frequency $f_R/2$ is also the frequency of the rectangular pulses of the periodic signal P. In order to get an output frequency of the apparatus that is only proportional to the signal current $i_H$ and thus to the Signal $u_H$, the constant reference frequency $f_R/2$ of the cycle signal P must be subtracted from the frequency $f_F$ of the output signal F. This happens with the help of a forwards/backwards-counter that exists in the form of an output frequency divider 8 at the output of the apparatus. The pulses of the output signal F of the D-flip-flop 7 are counted forwards and those of the periodic signal P are counted backwards. At the same time the output frequency divider 8 also divides the frequency difference $f_F-f_R/2$ by a number k. The construction of the output frequency divider 8 is shown can be found in FIG. 5.

Figure 5:
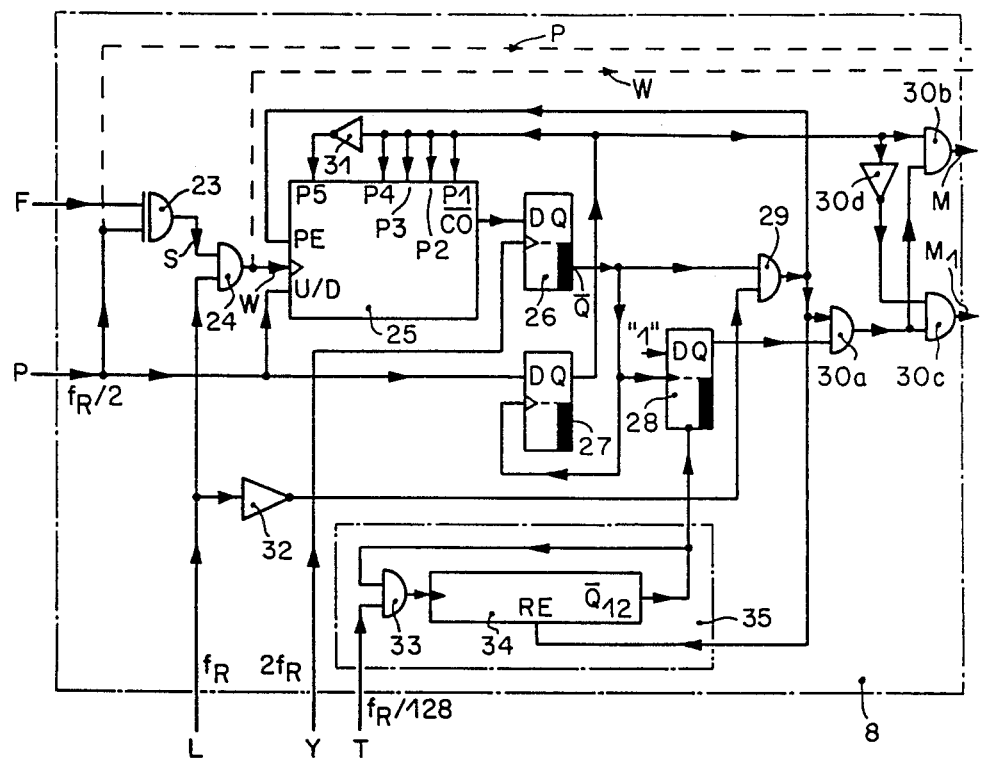
FIG. 5 shows a block diagram of an output frequency divider.

The output frequency divider 8 shown in FIG. 5 comprises an exclusive-or-gate 23, a first and-gate 24, a first counter 25, a first flip-flop 26 and a second flip-flop 27, a third flip-flop 28, a second and-gate 29, a third and-gate 30a, a fourth and-gate 30b, a fifth and-gate 30c, a first inverter 30d, a second inverter 31, a third inverter 32, a sixth and-gate 33 and a second counter 34. The first counter 25 is a binary forward/backwards-counter that, for instance, counts forward when at its U/D-input the logic value "1" occurs and that counts backwards, when at its U/D-input the logic value "0" occurs. All the flip-flops 26 through 28 are, for instance, D-flip-flops. The and-gate 33 and the counter 34 together form a monostable multivibrator 35. The clock inputs of the counter 25, of the flip-flop 26 and of the flip-flop 27 are controlled with leading edges and the clock inputs of the flip-flop 28 and of the counter 34 are, for instance, controlled with trailing edges. The flip-flop 28, the and-gate 30a and the monostable multivibrator 35 form a neutral-prevention-circuit 28;30a;35, that is of importance especially when the apparatus is used in an electric meter.

The first signal input of the output frequency divider 8 is the output signal F of the D-flip-flop 7. This signal is connected to a first input of the exclusive-or-gate 23. The second input is the periodic signal P which has a frequency $f_R/2$ and which is led to a second input of the exclusive-or-gate 23, to the U/D-input of the meter 25 and to a D-input of the flip-flop 27. The periodic input signal L of frequency $f_R$ is connected to an input of the and-gate 24 and over the inverter 32 to a first input of the and-gate 29. The periodic signal T with the frequency $f_R/128$ is connected to the and-gate 33. The periodic signal Y with the frequency $2f_R$ is connected to the periodic (i.e. clock) input of flip-flop 26.

Connected are:

The output of the exclusive-or-gate 23 to a second input of the and-gate 24, whose output is led to a clock input of the counter 25, the "carry-out"-output $\overline{CO}$ of the counter 25 is connected to the D-input of the flip-flop 26, whose Q-output is led to a second input of the and-gate 29 and to a periodic (i.e. clock) input of the flip-flop 27 and to a periodic (i.e. clock) input of the flip-flop 28, the output of the and-gate 29 is connected to a first input of the and-gate 30a, to the input PE of the counter 25 and to a set-back input RE of the meter 34, the Q-output of the flip-flop 27 is connected to the parallel inputs P1 through P4 of the counter 25 and to the first input of the and-gate 30b and also by way of the inverter 31 to the input P5 of the counter 25 and over the inverter 30d to the first input of the and-gate 30c, the Q-output of the flip-flop 28 is connected to a second input of the and-gate 30a, whose output is led to each second input of the and-gates 30b and 30c and the output of the and-gate 33 is connected to a periodic input of the counter 34, whose $\overline{Q_{12}}$-output is led to a second input of the and-gate 33 and to an inverting set-back input of the flip-flop 28.

At the D-input of the flip-flop 28 is a logic value "1". The outputs of the and-gate 30b and 30c form the two outputs of the output frequency divider 8, where the signals M and $M_1$ originate.

Since the counter 25 can not count forwards and backwards simultaneously, all pulses of the output signal F and of the cycle signal P that appear at the same time at the two signal inputs of the output frequency divider 8 are, with the help of the exclusive-or-gate 23, eliminated. This has no negative influence on the count value of the meter 25, since a pulse counted forwards and backwards would result in a count value zero anyway.

Figure 4:
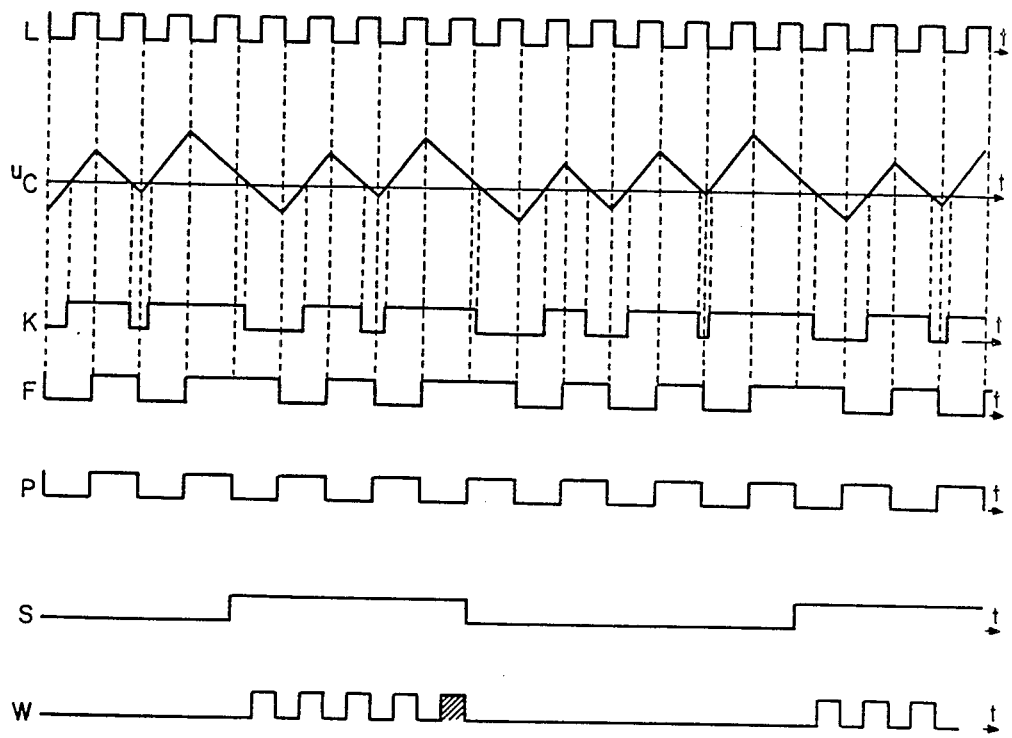
FIG. 4 shows timing diagrams belonging to the first alternative embodiment.

A logic value "1" appears at the output of the exclusive-or-gate 23 only, when the two signals F and P are different. The and-gate 24 serves as a pulse former that reduces the duration of the output pulses of the exclusive-or-gate 23 to those of the cycle signal L. FIG. 4 shows the temporal course of the cycle signal P in the fifth line, the output signal S of the exclusive-or-gate 23 in the sixth line and the output signal W of the and-gate 24 in the seventh line. The counter 25 counts the output pulses of the and-gate 24 forwrads when the cycle signal P that originates at its U/D-input has a logic value "1". It counts them backwards when the cycle signal P has a logic value "0". The negative pulses at the output $\overline{CO}$ of the counter 25 are transmitted with the next leading edge of the cycle signal Y into the flip-flop 26 and thus normally appear slightly delayed as positive pulses at the Q-output of the flip-flop 26. Their duration is, with the help of the inverted periodic signal L, restricted to the duration of the pulses of this periodic signal L, i.e. the and-gate 29 also works as a pulse former. Because of the static or the temporary varying polarity of the signal $u_H$, the counting direction may change. The initial count value of the meter 25 is not chosen to be, as usual, 0=00000 when counting forwards or to the maximum value 31=11111 when counting backwards, but it is set to the approximate middle of the counting range, for instance, the value 16=10000, if the state 00000 had been reached earlier when counting backwards (P="0") or 15=01111, if the state 11111 had been reached earlier when counting forwards (P="1"). This happens, when, with each positive edge of the output pulse of the flip-flop 26, the just existing logic value of the cycle signal P is taken over into the flip-flop 27. Thus, in order to initialize the counter 25, the Q-output of the flip-flop 27 applies a binary number 10000=16 when P="0" or a binary number 01111=15 when P="1" to the parallel inputs P5, P4, P3, P2, P1 of the counter 25. Each output pulse of the and-gate 29 serves to set this initial value in the counter 25 with the help of the input PE and at the same time, with the help of the set-back input RE switches the counter 34 back to zero. This setting process of the counter 25 also permits the logic value "1" to appear anew at its output $\overline{CO}$. This logic value "1" is normally, slightly delayed, taken over into the flip-flop 26. This ends the output pulse of the and-gate 29. If the flip-flop 28 is still set with a logic value "1", then this is caused by the negative edges of the output pulses at the Q-output of the flip-flop 26. Thus the Q-output of the flip-flop 28 releases the and-gate 30a. But since, at the same time, the output pulses of the and-gate 29 ends, as already mentioned, this output pulse does not reach the outputs of the output frequency divider 8, because the and-gate 30a is released too late for it. The set-back of the meter 34 by the output pulse of the and-gate 29 causes the $\overline{Q_{12}}$-output of the meter 34 to take a logic value "1" that releases the and-gate 33. As soon as the output pulse of the and-gate 29 is finished, the meter 34 begins to count the pulses of the rectangular cycle signal T. If the meter 34 is not set back to zero in the meantime by an output pulse of the and-gate 29, then it counts until a logic value "0" appears at its $\overline{Q_{12}}$-output, that on one hand sets back the flip-flop 28 to zero and on the other hand blocks and and-gate 33 and thus ends the counting process of the meter 34. A logic value "0" appears at the $\overline{Q_{12}}$-output of the meter 34 after $2^{12-1}=2^{11}$ periods of the duration 128/$f_R$ of the cycle signal T, i.e. after $2^{18}/f_R$ seconds, which results with $f_R=2^{10}$ Hz in a duration of $2^8=256$ seconds.

When t is longer than 256 seconds the neutral-prevention-circuit 28;30a;35 prevents a pulse appearing at the output $\overline{CO}$ of the meter 25 from being retransmitted to the outputs of the output frequency divider 8. Since, after 256 seconds, the flip-flop 28 is set back to zero by the output signal of the meter 34, the and-gate 30a is blocked for every first pulse. During normal use, when a signal $u_H$ is positioned at the input of the apparatus, the first pulse appearing at the $\overline{Q}$-output of the flip-flop 26 is thus not retransmitted to the outputs of the output frequency divider 8 (initial error), but its negative edge sets a logic value "1" in the flip-flop 28. Thus the Q-output of the flip-flop 28 releases the and-gate 30a i.e. for all following pulses. The latter is caused by the fact, that each new output pulse of the and-gate 29 sets the meter 34 back to zero before 256 seconds pass. Thus the meter 34 is forced each time to begin its counting process with zero, so that a logic value "0" will never appear at its $Q_{12}$-output and thus the flip-flop 28 will never be set back to zero. Thus the release of the and-gate 30a lasts until no pulse appears before 256 seconds pass. The medium frequency of the output pulse of the meters 25, of the flip-flop 26 and of the and-gate 29 and of the and-gate 30a is in this case proportional to the signal current $i_H$ and thus also proportional to the signal $u_H$.

However in the neutral condition, when no signal $u_H$ is positioned at the input of the apparatus, it is possible that the integration of very small interruption signals finally produces, over a very long time, also a pulse at the output of the and-gate 29. As all other first pulses it does not reach the outputs of the output frequency divider 8, since the and-gate 30a is blocked. However all other neutral-pulses do not reach these outputs either, since their intervals relative to each other and to the first pulse are always bigger than 256 seconds. This means: each time, before the meter 34 is set back to zero by the pulse, it has enough time, to let a logic value "0" appear at its $Q_{12}$-output. This logic value "0" sets back the flip-flop 28 to zero each time and thus blocks the and-gate 30a in time before the next pulse appears.

The output signal of the flip-flop 27 indicates, which polarity the signal $u_H$ has. When the values of the signal $u_H$ are positive, it releases the and-gate 30b, so that the output signal of the and-gate 30a reaches the output of the and-gate 30b as signal M. When the values of the signal $u_H$ are negative however, it releases the and-gate 30c, so that this time the output signal of the and-gate 30a reaches the output of the and-gate 30c as signal $M_1$.

In case of an electricity meter, $u_H$ is proportional to $u_N \cdot i_L \cdot u_N$ is the network voltage of an energy supply network and $i_L$ is a charge current. The electricity meter shown in FIG. 6 comprises a polarity reversing switch 1, a multiplier 36, the already described circuit 2, another optional frequency divider 37, an interface circuit 38, a stepping motor 39, an indicator 40 and an optical indicator exemplified by a luminous diode $D_1$. The network voltage $u_N$ reaches the input of the polarity reversing switch 1 and the input of the circuit 2 is fed by the A.C. control voltage N in a two-pole manner. A voltge $u_L$ proportional to the charge current $i_L$ reaches a first input of the multiplier 36 by way of two poles, while the output of the polarity reversing switch 1 is connected by means of two poles to the second input of the multiplier 36. The output of the multiplier 36 is led twopoled to the signal input of the circuit 2, one pole being rounded.

Connected are:
The output 22a of the circuit 2 is connected to a periodic input of the frequency divider 37 and a set-back input of the interface circuit 38,
the output 21 of the circuit 2 is connected to a clock input of the interface circuit 38,
the output of the frequency divider 37 is connected to a signal input of the interface circuit 38, and
the output of the circuit 2 where the switch signal A or B is positioned, is connected to the control input of the polarity reversing switch 1.

Figure 6:
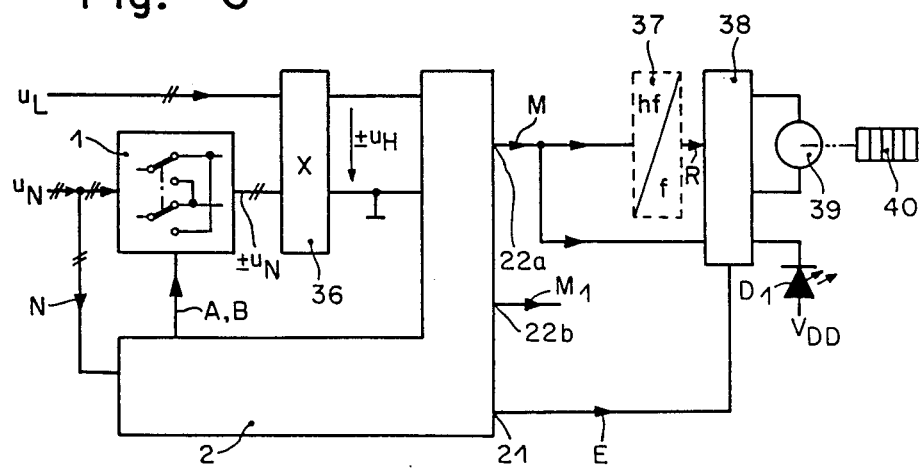
FIG. 6 shows a block diagram of an electric meter.

A twopoled output of the interface circuit 38 is connected to the electric connections of the stepping motor 39 that drives the indicator 40 mechanically. An additional output of the interface circuit 38 is connected onepoled to the cathode of the luminous diode $D_1$ whose anode is connected to the positive D.C. current supply voltage $V_{DD}$. If the electric meter only measures positive energy, then the signal output 22b of the circuit 2 is not to be connected. Instead of connecting the polarity reversing switch 1, as shown in FIG. 6, at the input side of the multiplier 36, it can also be connected to the output side of the multiplier 36. In both cases, the input signal $\pm u_N$ is proportional to the product $\pm u_N \cdot i_L$. The multiplier 36, for instance, programmable.

According to FIG. 6, the polarity reversing switch 1 transforms the network voltage $u_N$ into the periodically switched voltage $\pm u_N$ that, in the multiplier 36, is multiplied with the voltage $u_L$, so that at the input of the circuit 2, a voltage $\pm u_H$ originates that is proportional to the product $\pm u_N \cdot i_L$ and thus proportional to the electric power. The frequency of the rectangular pulses appearing at the output 22a of the circuit 2 is optionally divided by a number h by the frequency divider 37. The resulting rectangular pulses are processed in a known manner in the interface circuit 38, so that they can control the stepping motor 39. With the reception of each pulse, the stepping motor 39 moves one step forwards. After a presupposed number of steps, for instance 300 steps, the value shown by the indicator 40 is incremented by one. Instead of an electromechanical indicator 40, a fully electronic luminous diode or a liquid crystal indicator may be used. In this case, the stepping motor 39 and its interface circuit 38 may be left out and instead an additional frequency divider may be used with an accumulator. The luminous diode $D_1$ blinks, for instance, in the synchronously with the pulses of the signal M and it can be used to measure the pulse frequency optically.

Figure 7:
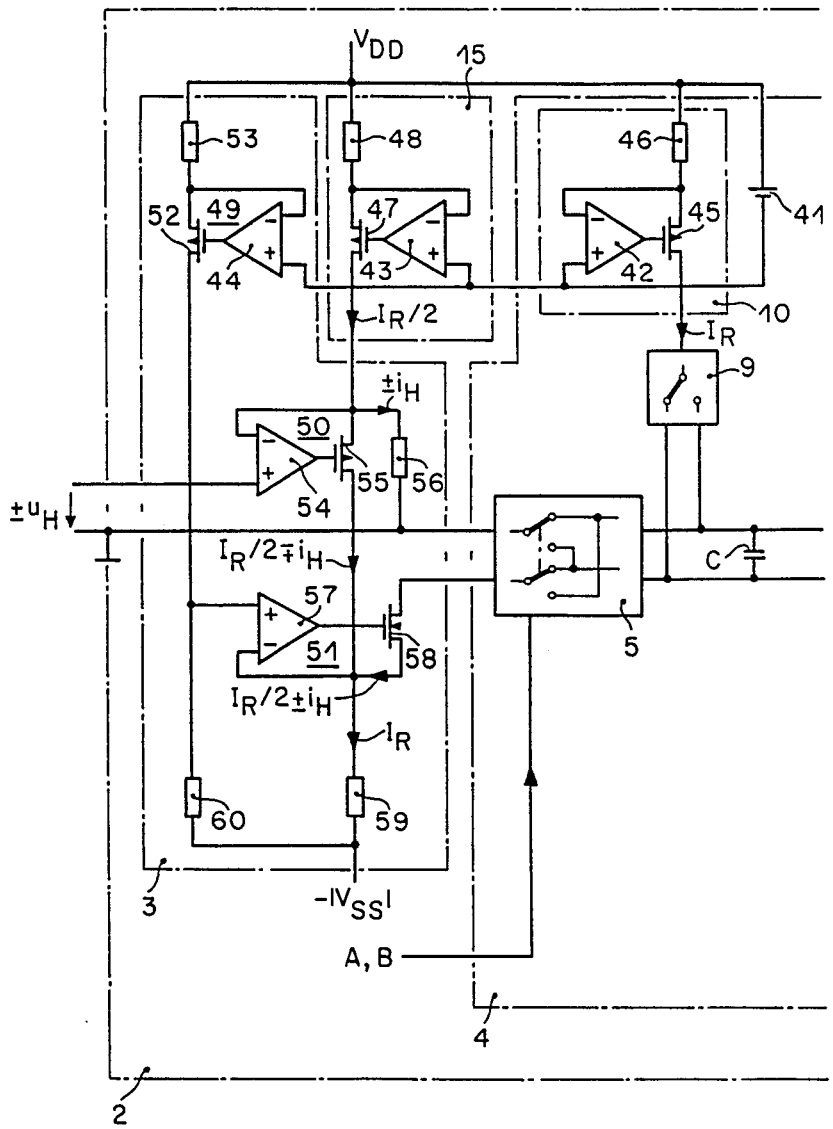
FIG. 7 shows a diagram of the input part of a circuit.

The input element of circuit 2 shown in FIG. 1 is constructed in a preferably monolithically integrated circuit as shown in FIG. 7. The construction of the voltage/current converter 3 and of the constant current sources 10 and 15 are shown in detail, while the rest of the input element of circuit 2 is only indicated. The two constant current sources 10 and 15 and the current sources incorporated into the voltage/current converter 3 each comprise an operational amplifier, a field effect transistor and at least one resistor. The value of the resistor determines the value of the output current of the current source. The construction of such precision current sources is known as such from the book Advanced Electronic Circuits, Tietze and Schenk, Springer Verlag, 1978, pages 57 through 63. Three of the constant current sources used in FIG. 7 need a mutual constant voltage source 41 of, for instance, 1.235 volts. The positive pole of this constant voltage source 41 is connected to the positive D.C. supply voltage $V_{DD}$ and its negative pole is connected to each of the non-inverting inputs of the three operational amplifiers 42, 43 and 44.

The constant current source 10 comprises the operational amplifier 42, whose output is directed to a gate-connection of a field effect transistor 45, while a second connection of the field effect transistor 45 is directly connected to an inverting input of the operational amplifier 42 and, over a resistor 46, to the positive D.C. supply voltage $V_{DD}$. A third connection of the field effect transistor 45 forms the output of the constant current source 10 and supplies the reference current $I_R$. The output of the constant current source 10 is, by way of the switch 9, directed to the output pole of the polarity reversing switch 5 and to a pole of the capacitor C.

The constant current source 15 comprises an operational amplifier 43, a field effect transistor 47 and a resistor 48. The voltage/current converter 3 comprises a constant current source 49 and two current sources 50 and 51. The constant current source 49 comprises the operational amplifier 44, a field effect transistor 52 and a resistor 53. The current source 50 is constructed of an operational amplifier 54, a field effect transistor 55 and a resistor 56, while the current source 51 comprises an operational amplifier 57, a field effect transistor 58 and a resistor 59. The construction of all current sources 15, 49, 50 and 51 is identical as the one of the constant current source 10. However, the second connection of the field effect transistor 55 over the resistor 56 is not connected to the positive D.C. supply voltage $V_{DD}$, but to the ground and the connection of the field effect transistor 58 over the resistor 59 is not connected to the positive D.C. supply voltage $V_{DD}$, but to the negative D.C. supply voltage $-V_{SS}$. The input pole of circuit 2 that is not grounded and the output of the constant current source 49 are directed to non-inverting inputs of the operational amplifiers 54 and 57 respectively. The non-inverting input of the operational amplifier 57 is also connected by way of a resistor 60 to the negative D.C. supply voltage $-V_{SS}$. The output of the constant current source 15 supplies half the reference current, $I_R/2$, and is connected to the inverting input of the operational amplifier 54, while the output of the current source 50 is directed to the inverting input of the operational amplifier 57. The current source 50 works as voltage/current converter that switches the voltage signal $\pm u_H$ into a proportional current $\pm i_H$ that flows in the resistor 56. In the field effect transistor 55, the proportional current $\pm i_H$ is subtracted from half the reference current $I_R/2$ that is supplied by the constant current source 15. In the current source 51, that produced the reference current $I_R$ in the resistor 59, this difference current $I_R/2 \mp i_H$ at the output of the current source 50 is subtracted from the reference current $I_R$, so that, at the output of the current source 51 and thus at the output of the voltage/current converter 3, the desired current $\pm i_H + I_R/2$ originates. The output of the current source 51 and the ground together form the twopoled output of the voltage/current converter 3 and are connected to the twopoled input of the polarity reversing switch 5.

Figure 8:
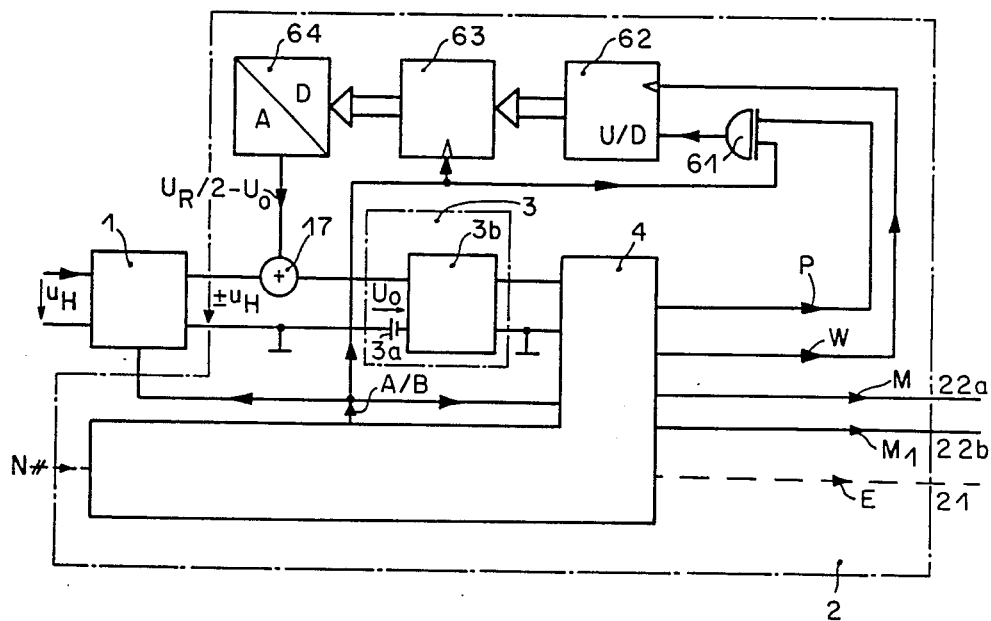
FIG. 8 shows a block diagram of a forth alternative of a signal to frequency conversion apparatus, in accordance with a fourth illustrative embodiment of the invention.

The fourth alternative of the apparatus shown in FIG. 8 is constructed similar to the second alternative shown in FIG. 2. Only the constant voltage source 16 is substituted by the circuit 61;62;63;64 as voltage source. The output voltage $U_R/2 - U_o$ of the circuit 61;62;63;64 substitutes for the reference signal $U_R/2$ of the constant current source 16. The circuit 61;52;63;64 comprises an exclusive-or-gate 61, a forwards/backwards-counter 62, an intermediate accumulator 63 and a digital-analog converter 64. Between the forwards/backwards-counter 62 and the intermediate accumulator 63 on one hand and between the intermediate accumulator 63 and the digital/analog-converter 64 on the other hand a data bus connection exists. One output of circuit 4 is the switch signal A or B which is connected to a first input of the exclusive-or gate 61 and to a clock input of the intermediate accumulator 63. The signals W and of circuit 4 (see FIG. 1) are, in this fourth alternative, additionally directed to a clock input of the forwards/backwards counter 62 and to a second input of the exclusive-or gate 61, respectively (see FIG. 8). The output of the exclusive-or gate 61 is connected to an up-down input U/D of the forwards/backwards counter 62.

In the second alternative (see FIG. 2), the average value of the offset voltage $U_0$ is eliminated from the output frequency of the apparatus. However, in the fourth alternative (see FIG. 8), there is, by the offset voltage $U_0$ additionally eliminated a frequency modulation of the output signals M and $M_1$ of the apparatus. The forwards/backwards counter 62 (see FIG. 8) works similarly to the meter 25 in the output frequency divider 8 (see FIG. 5). The difference is that the counting direction of the forwards/backwards counter 62, thanks to the existence of the exclusive-or gate 61, is, during the odd half periods, opposite to those that apply during the odd half periods of the switch signal A or B. During an odd half peroid, the counting of the forwards/backwards counter 62 gives the count value $(f_H+f_0)\cdot T/2$ and during an even half period the count value $-(f_H-f_0)\cdot T/2$, so that during a whole period T of the switch signal A or B a count value $(f_H+f_0)\cdot T/2 - (f_H-f_0)\cdot T/2 = 2f_0\cdot T/2 = f_0\cdot T$ is obtained. $f_H$ is the part of the frequency $f_F$ that corresponds to the signal $u_H$ and $f_0$ is the part of the signal that corresponds to the offset voltage $U_0$. The count value $f_0\cdot T$ is thus proportional to the offset voltage $U_0$. At the end of each period T, this count is entered with the positive edges of the switch signals A or B into the intermediate accumulator 63, in order to be switched afterwards, with the help of the digital/analog converter 64, into an analog value. In the circuit 17;3;4;61;62;63;64, the analog value at the output of the digital/analog converter 64 equals $U_R/2 - U_0$. The analog output of the digital/analog converter 64 is connected to the first input of the addition element 17. The output current of the voltage/current-converter 3 is thus, as demanded, proportional to the addition voltage $\pm u_H + U_R/2 - U_0 + U_0 = \pm u_H + U_R/2$. The second offset voltage $U_0$ is introduced by the voltage/current-converter 3 into the circuit. There is thus no part of the zero voltage $U_0$ left in the output current of the voltage/current-converter 3.

Finally, the above described embodiments of the invention are intended to be illustrative only. Numerous alternative embodiments may be devised by those skilled in the art without departing from the spirit and shape of the following claims.

I claim:

1. A method for converting an electrical signal into a proportional frequency comprising the steps of
periodically switching said electrical signal with a first polarity reversing switch, adding a first reference signal to a signal proportional to said periodically switched electrical signal to form an addition signal, periodically switching said addition signal with a second polarity reversing switch which is switched synchronously with the first polarity reversing switch, successively charging and discharging an integrating capacitor by means of a current component proportional to said periodically switched addition signal and a selectively switched reference current, said reference current comprising a second reference signal whose value corresponds to twice the signal value of the first reference signal, comparing a voltage of the capacitor with a reference voltage to selectively switch said reference current, so as to enable production of a signal whose average frequency is proportional to the sum of said electrical signal and said first reference signal, and subtracting a frequency proportional to said first reference signal to produce a signal whose frequency is proportional to said electrical signal.

2. A method in accordance with claim 1, wherein the first reference signal is a D.C. voltage that is added to the periodically switched electrical signal to be converted, said addition signal comprising an addition voltage which is connected to a current by way of a voltage-to-current converter.

3. A method in accordance with claim 2, wherein the said D.C. voltage is reduced by an offset voltage of said voltage-to-current converter.

4. The method of claim 1 wherein after said first polarity switching step said electrical signal is converted to a proportional current, and wherein said first reference signal is a D.C. current.

5. A method in accordance with claim 1 wherein after said first polarity switching step said electrical signal is amplified.

6. A method in accordance with claim 1 wherein the frequency to be subtracted is represented by a periodic signal of rectangular pulses.

7. An apparatus for converting an electrical signal into a proportional frequency comprising, a first polarity reversing switch for periodically switching the polarity of said electrical signal, means for adding a first reference signal to a signal proportional to said periodically switched electrical signal to form an addition signal, a second polarity reversing switch which is switched synchronously with said first polarity reversing switch for periodically switching the polarity of said addition signal, an integrating capacitor which is successively charged and discharged by means of a current component proportional to said periodically switched addition signal and a selectively switched reference signal whose magnitude corresponds to twice the signal magnitude of said first reference signal, comparator means for comparing the capacitor voltage with a reference voltage to selectively switch said reference current, thereby enabling production of a signal whose average frequency is proportional to the sum of said electrical signal and said first reference signal, and means for subtracting a frequency proportional to the first reference signal to produce a signal whose frequency is proportional to said electrical signal.

8. An apparatus in accordance with claim 7 wherein said apparatus includes a voltage-to-current converter between said polarity reversing switches and said first reference signal is a voltage connected with an addition element at an input of said voltage-current converter.

9. An apparatus in accordance with claim 8, wherein the voltage is a constant voltage.

10. An apparatus in accordance with claim 8, wherein the voltage is produced by a voltage source comprising an exclusive-or-gate, a forwards/backwards counter, an intermediate accumulator, and a digital-to-analog converter.

11. An apparatus in accordance with claim 7, wherein the apparatus includes a voltage-to-current converter between said polarity reversing switches and the first reference signal is a constant current connected to the output of the voltage-to-current converter.

12. An apparatus in accordance with claim 7 wherein a voltage-to-current converter is connected between said first and second polarity reversing switches and a high pass amplifier is connected between the first polarity reversing switch and the voltage-to-current converter.

13. An apparatus in accordance with claim 12, wherein the high pass amplifier comprises an amplifier and a high pass filter connected at the output of the amplifier.

14. An apparatus in accordance with claim 7 wherein a flip-flop is connected at the output of said comparator means and a frequency divider comprising an exclusive or gate, two additional flip-flops, two and-gates, and a forwards-backwards counter.

15. An apparatus in accordance with claim 14, wherein the frequency divider comprises a neutral-prevention circuit.

16. An apparatus in accordance with claim 15, wherein the neutral-prevention circuit comprises a monostable multivibrator, a flip-flop, and an and-gate.

17. An apparatus in accordance with claim 16, wherein the monostable multivibrator comprises an and-gate and a meter.

18. An apparatus in accordance with claim 7 wherein a voltage-to-current converter is located between said first and second polarity reversing switching, said voltage-to-current comprising three current sources.

19. An apparatus in accordance with claim 7 wherein said reference signals are each formed using an operational amplifier, a field effect transistor, and a resistor.

* * * * *